(12) United States Patent
Cho et al.

(10) Patent No.: US 6,472,290 B2
(45) Date of Patent: Oct. 29, 2002

(54) ISOLATION IN MICROMACHINED SINGLE CRYSTAL SILICON USING DEEP TRENCH INSULATION

(75) Inventors: Dong-il Cho; Sangwoo Lee; Sangjun Park; Sangchul Lee, all of Seoul (KR)

(73) Assignee: Chromux Technologies, Inc., Chatsworth, CA (US)

( * ) Notice: Subject to any disclaimer, the term of this patent is extended or adjusted under 35 U.S.C. 154(b) by 0 days.

(21) Appl. No.: 09/756,981

(22) Filed: Jan. 9, 2001

(65) Prior Publication Data

US 2001/0013630 A1 Aug. 16, 2001

(30) Foreign Application Priority Data

Jan. 13, 2000 (KR) .......................................... 2000-1550

(51) Int. Cl.[7] ..................... H01L 21/76; H01L 21/4763; H01L 21/302
(52) U.S. Cl. ..................... 438/411; 438/412; 438/619; 438/739
(58) Field of Search ..................... 438/411, 412, 438/426, 619, 739, 50; 257/419

(56) References Cited

U.S. PATENT DOCUMENTS

| | | | |
|---|---|---|---|
| 5,637,539 A | * 6/1997 | Hofmann et al. | 438/20 |
| 5,930,595 A | 7/1999 | Sridhar et al. | 438/52 |
| 5,950,102 A | * 9/1999 | Lee | 438/619 |
| 6,048,774 A | * 4/2000 | Yamamoto et al. | 438/406 |
| 6,122,090 A | * 9/2000 | Kino et al. | 359/224 |
| 6,150,275 A | 11/2000 | Cho et al. | 438/696 |
| 6,281,508 B1 | * 8/2001 | Lee et al. | 250/396 |
| 6,297,145 B1 | * 10/2001 | Ito | |
| 6,306,754 B1 | * 10/2001 | Agarwal | 438/619 |

FOREIGN PATENT DOCUMENTS

JP 36211826 A * 5/1987

OTHER PUBLICATIONS

James A. Walker, "Topical Review—The Future of MEMS in Telecommunications Networks," J. Micromech. Microeng. 10 (2000), pp. R1–R7.

(List continued on next page.)

Primary Examiner—John F. Niebling
Assistant Examiner—Viktor Simkovic
(74) Attorney, Agent, or Firm—Hogan & Hartson L.L.P.

(57) ABSTRACT

An electrical isolation method for silicon microelectromechanical systems provides trenches filled with insulation layers that support released silicon structures. The insulation layer that fills the trenches passes through the middle portion of the electrodes, anchors the electrodes to the silicon substrate and supports the electrode. The insulation layers do not attach the electrode to the sidewalls of the substrate, thereby forming an electrode having an "island" shape. Such an electrode is spaced far apart from the adjacent walls of the silicon substrate providing a small parasitic capacitance for the resulting structure. The isolation method is consistent with fabricating a complex structure or a structure with a complicated electrode arrangement. Furthermore, the structure and the electrode are separated from the silicon substrate in a single release step. Additionally, a metal layer is deposited on the surfaces of the structure and electrodes without using separate photolithography and etching steps.

19 Claims, 15 Drawing Sheets

OTHER PUBLICATIONS

Cornel Marxer, et al., "Vertical Mirrors Fabricated by Deep Reactive Ion Etching for Fiber–Optic Switching Applications," Journal of Microelectromechanical Systems, vol. 6, No. 3, Sep. 1997, pp. 277–285.

Sangwoo Lee, et al., "A New Micromachining Technique with (11) Silicon," Jpn, J. Appl. Phys. vol. 38, part 1, No. 5A, May 1999, pp. 2699–2703.

Sangwoo Lee, et al., "The Surface/Bulk Micromachining (SBM) Process: A New Method for Fabricating Released MEMS in Single Crystal Silicon," Journal of Microelectromechanical Systems, vol. 8, No. 4, Dec. 1999, pp. 409–416.

Sangwoo Lee, et al., "Surface/Bulk Micromachined Single–Crystalline Micro–Gyroscope," In press to appear JMEMS, Dec. 2000, pp. 1–50.

* cited by examiner

ISOLATION IN MICROMACHINED SINGLE CRYSTAL SILICON USING DEEP TRENCH INSULATION

PRIORITY AND RELATED APPLICATION

The present application claims priority under 35 U.S.C. §119 from Korean patent application No. 2000-1550, "Isolation Method for Single Crystalline Silicon in Micromachining Using Deep Trench Insulation Layers," filed with the Korean Industrial Property Office on Jan. 13, 2000.

BACKGROUND OF THE INVENTION

1. Field of the Invention

The present invention relates generally to microelectromechanical systems and more specifically to such systems that include an electrical isolation structure and to methods for electrically isolating a part of a single crystalline silicon microstructure using a deep trench insulation layer in a microelectromechanical system.

2. Description of the Related Art

Microelectromechanical systems include component structures with typical minimum dimensions on the order of a micron where the component structures can have elaborate shapes and perform a variety of complex functions. The component structures of microelectromechnical systems are formed on a semiconductor or glass substrate. Microelectromechanical systems include devices such as accelerometers that sense the acceleration of a moving object, gyroscopes that sense the angular rate of a rotating object and mirror arrays that deflect light in fiber optic communication and display applications. Micromachining techniques are used to fabricate the very small structures that are integrated with electrical parts on the semiconductor or glass substrate. The techniques used to fabricate these microelectromechanical systems are largely based on semiconductor device fabricating technology, including photolithography, thin film deposition, etching, impurity doping by diffusion and ion implantation, electroplating and wafer bonding.

Microelectromechanical systems often include moving parts that are suspended from or tethered to an underlying substrate and that can move independently of the underlying substrate. Microelectromechanical systems also include electrodes that are electrically isolated to allow the electrodes, for example, to measure electrical signals flowing in the moving parts of the system. Other types of electrodes are used to apply electrical signals to the moving parts of the system; this application also requires that the electrodes be electrically isolated. Electrodes have to be electrically isolated from one another, and also from the substrate on which the electrodes and the tethered moving parts are fabricated. Many methods for electrically isolating a part of a microelectromechanical system from other parts of the system have been studied.

FIG. 1 shows process steps in the conventional isolation process known as the single crystalline reactive etching and metallization (hereinafter, referred to as "SCREAM") process. The SCREAM isolation method fabricates a structure by the SCREAM micromachining technique in the manner discussed in U.S. Pat. No. 5,563,343; U.S. Pat. No. 5,198,390; and K. A. Shaw, Z. L. Zhang, and N. C. MacDonald, "SCREAM I: A Single Mask, Single-Crystal Silicon, Reactive Ion Etching Process for Microelectromechanical Structures," Sensors and Actuators A, Vol. 40, pp. 63, 1994. Plasma enhanced chemical vapor deposition (hereinafter, "PECVD") covers all surfaces of a micromachined structure with an oxide film. Selective deposition of metal film on the structure forms electrodes and electrically conducting paths on top of the PECVD. oxide film. In this SCREAM process, electrical isolation of the electrodes is achieved by depositing the metal film only on the top and the side surfaces of microelectromechanical structures.

The SCREAM isolation method has the advantage of being relatively simple in not requiring separate photolithography and etching steps once the structure is fabricated using the SCREAM micromachining technique. On the other hand, the coverage achieved in the deposition of the metal film is generally poor and hence the SCREAM isolation method typically cannot be applied to tall structures having a high aspect ratio. It should be noted that, if a metal or other material is deposited that has good step coverage, such as metal films deposited by low pressure chemical vapor deposition (hereinafter, referred to as "LPCVD"), all electrodes and microelectromechanical parts are electrically connected, and hence, electrical isolation is not achieved.

FIG. 2 shows the silicon on oxide insulator (hereinafter, "SOI") wafer method, used in forming the microelectromechanical systems described in the following references: B. Diem, et al., "SOI(SIMOX) as a Substrate for Surface Micromachining of Single Crystalline Silicon Sensors and Actuators," Tech. Dig. 7th Int. Conf. Solid-State Sensors and Actuators (Transducers '93), Yokohama, Japan, 1993, pp. 233–236; and C. Marxer, et al., "Vertical Mirrors Fabricated by Deep Reactive Ion Etching for Fiber-Optic Switching Applications," IEEE/ASME Journal of Microelectromechanical Systems, Vol. 6, No. 3, pp. September 1997. In the SOI wafer method, the portion of the wafer on top of the buried oxide layer (hereinafter, the "device layer") is highly doped, conducting silicon. Since all structures and electrodes are fabricated in the device layer and are defined by etching the device layer to the buried oxide layer, electrical isolation of the resulting electrodes is achieved automatically. On the other hand, SOI wafers are generally expensive and the residual stress created by the buried oxide layer can warp and change the shape of microelectromechanical structures. In addition, the micromachined portions of the device layer silicon near the oxide interface can have roughened features (known as the "footing" effect) when the structures and electrodes are formed in a deep plasma etching process. Another disadvantage of the SOI process is that the as-manufactured wafer has an established thickness of the oxide film and the device layer and these thicknesses cannot be modified once a wafer is manufactured.

FIG. 3 shows a scanning electron microscope (SEM) photograph of a micromachined comb-drive structure fabricated from single crystal silicon. The electrodes of the comb-drive structure of the illustrated structure are isolated using the junction isolation method. The junction isolation method is described, for example, in S. Lee, S. Park and D. Cho, "The Surface/Bulk Micromachining (SBM) Process: A New Method for Fabricating Released Microelectromechanical Systems in Single Crystal Silicon," IEEE/ASME J. Microelectromechanical Systems, Vol. 8, No. 4, December 1999. The junction isolation method forms a junction diode on a lightly doped N-type or P-type wafer. Applying a reverse biased voltage to the junction diode isolates the junction electrode from the substrate. Referring to FIG. 3, the silicon substrate 10 is lightly doped P-type and the lighter parts 12, including the comb-drive structure, are highly doped with phosphorus, such that a PN junction between the silicon substrate 10 (P-type) and the electrode 12 (N-type) is formed. In this case, if a reverse bias voltage is applied to the PN junction, the electrodes 12 are electrically isolated from the silicon substrate 10. This method has the advantage that the isolation steps are done before the micromechanical structure is fabricated, so that the structure can be fabricated in a relatively easy manner. On the other hand, the method has disadvantage that the depth of the PN junction often cannot be made sufficiently deep, so that this process usually is not readily applied to a tall structure having a high aspect ratio.

FIG. 4 is a structure formed by yet another conventional isolation method, the trench oxide isolation method, described in the following references: U.S. Pat. No. 5,930, 595; U. Sridhar et al., "Trench Oxide Isolated Single Crystal Silicon Micromachined Accelerometer," IEEE IEDM, San Francisco Calif., Dec. 6–9, 1998. pp. 475–478; and S. Lee, S. Park, D. Cho and Y. Oh "Surface/Bulk Micromachining (SBM) Process and Deep Trench Oxide Isolation Method for MEMS", IEEE IEDM, Washington, D.C., Dec. 5–8, 1999. pp. 701–704. This trench isolation method includes forming U-shaped trenches 14 on a silicon substrate 16, forming thermal oxide layers 18 and depositing oxide layers 20 on all sides of the structure where the trenches are formed. The oxide films 18, 20 filling the trenches attach the electrode structures 22, 24 to the silicon substrate 16 through the respective sidewalls so that the oxide films support the electrodes and tethered structures. The oxide films electrically isolate the electrodes from each other and from the substrate.

This method has the advantage that the method can be applied to a tall structure having a high aspect ratio. On the other hand, separate photolithography and etching steps undesirably are required to form a metal layer on the electrode, which is required for wire bonding the electrode to a package. Two different release processes are required: one to separate the electrode, component from the substrate and a second to separate the structure part from the substrate. The trenches between the sidewalls of the electrode and the sidewalls of the substrate generally cannot be made arbitrarily large, as would be desired to achieve a small parasitic capacitance, without sacrificing the structural rigidity of the trench filled oxide layers that support the structure and electrodes.

Additionally, the insulation layers the conventional trench isolation method deposits on the sides of the electrode are used to support the structure and electrodes. Therefore, the insulation layers must be deposited between the electrode and the substrate, which in turn, results in severe limitations on electrode shapes that can be fabricated. In particular, it is difficult to fabricate an electrode in an "island" shape. Therefore, it can be appreciated that this method is difficult to use in microelectromechanical systems having a complicated electrode arrangement. Those skilled in the art can appreciate the need for a simpler isolation method.

SUMMARY OF THE INVENTION

An aspect of the present invention is an isolation method for microelectromechanical systems. The method includes etching a trench into a substrate, the trench having a depth at least as large as a sum of a thickness of an electrode to be formed and a separation distance between the electrode to be formed and an underlying surface of the substrate, the trench formed in an interior portion of the electrode to be formed. An insulation layer is formed within the trench. The electrode is patterned by etching around a periphery of the electrode to a depth greater than a thickness of the electrode. The substrate is laterally etched below the electrode, to at least partially separate the electrode from the underlying substrate, leaving the insulation layer in at least part of the trench so that the insulation layer anchors the electrode to the substrate and provides support for the electrode.

Another aspect of the present invention is an isolation method for microelectromechanical systems made of silicon, using deep trench insulation layers. The isolation method includes forming trenches to have a depth larger than the sum of the thickness of electrodes to be formed and a vertical separation between the electrodes to be formed and the underlying substrate. The trenches are formed in middle portions of the electrodes to be formed. The trenches are filled with insulation and the electrodes and etch holes are patterned. The electrodes are separated from the underlying substrate by etching the substrate laterally, below the electrodes and through the etch holes, so that the insulation in the trenches provides support for the electrodes spaced from the underlying substrate.

Yet another aspect of the present invention provides a microelectromechanical system including a substrate having two electrodes formed above a recessed surface of the substrate, each of the electrodes have a lower surface facing and spaced from the recessed surface. Trenches extend at least partially through corresponding ones of the electrodes and into the substrate at positions corresponding to the trenches through the electrodes. The trenches are formed in an interior portion of the electrodes. Insulation fills each of the trenches within the electrodes and the corresponding trenches in the substrate, the insulation extending between the electrodes and the substrate to support the electrodes and anchor the electrodes to the substrate. A peripheral separation between the electrodes is at least partially filled with air.

DETAILED DESCRIPTION OF THE PREFERRED EMBODIMENTS

Figure 1:
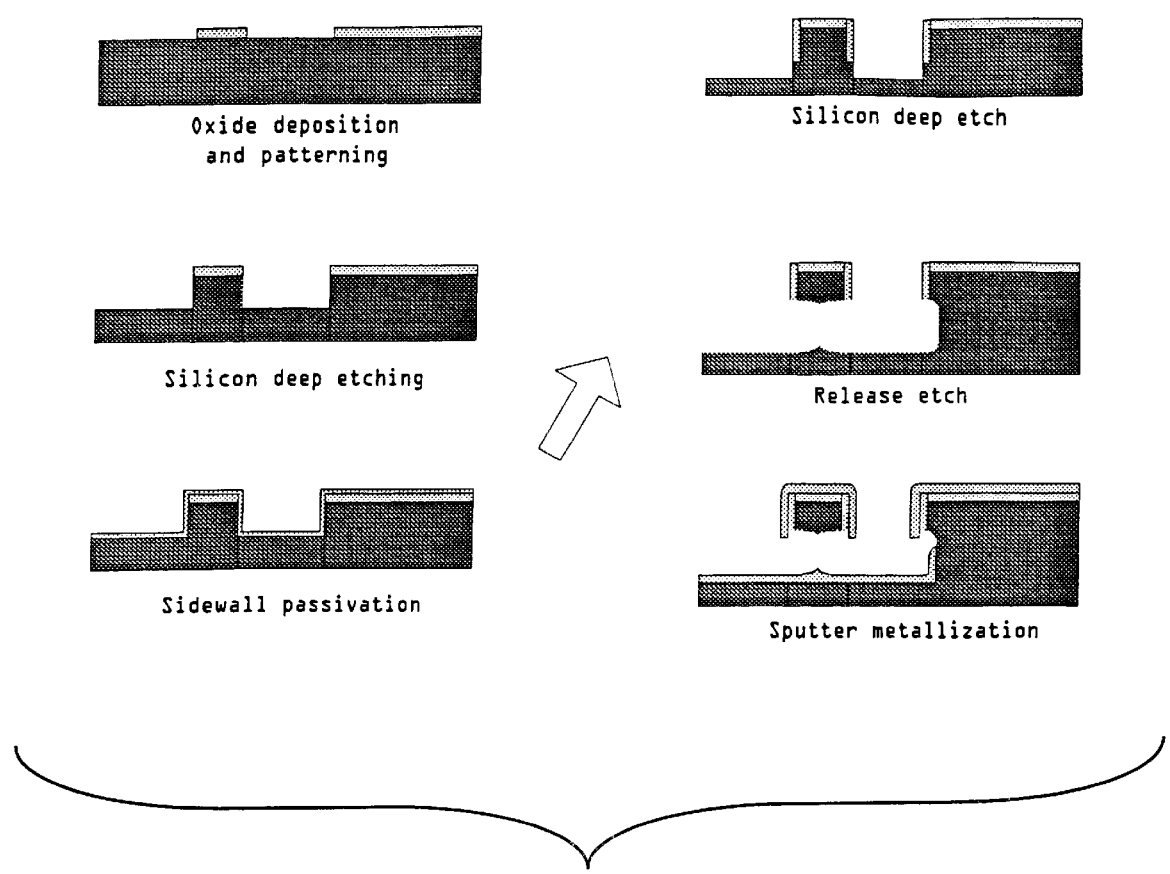
FIG. 1 shows a process flow of the SCREAM isolation method.
Figure 2:
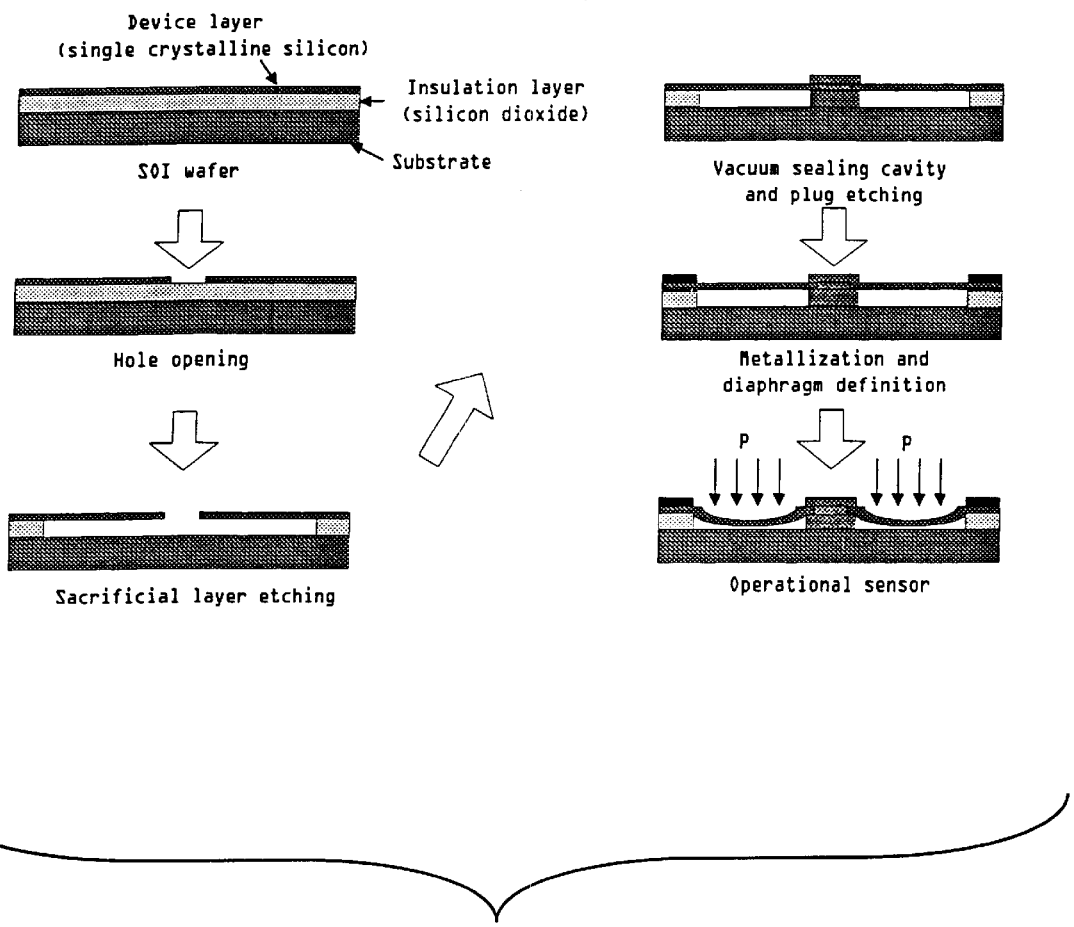
FIG. 2 shows a process flow of the SOI wafer insulation method.
Figure 3:
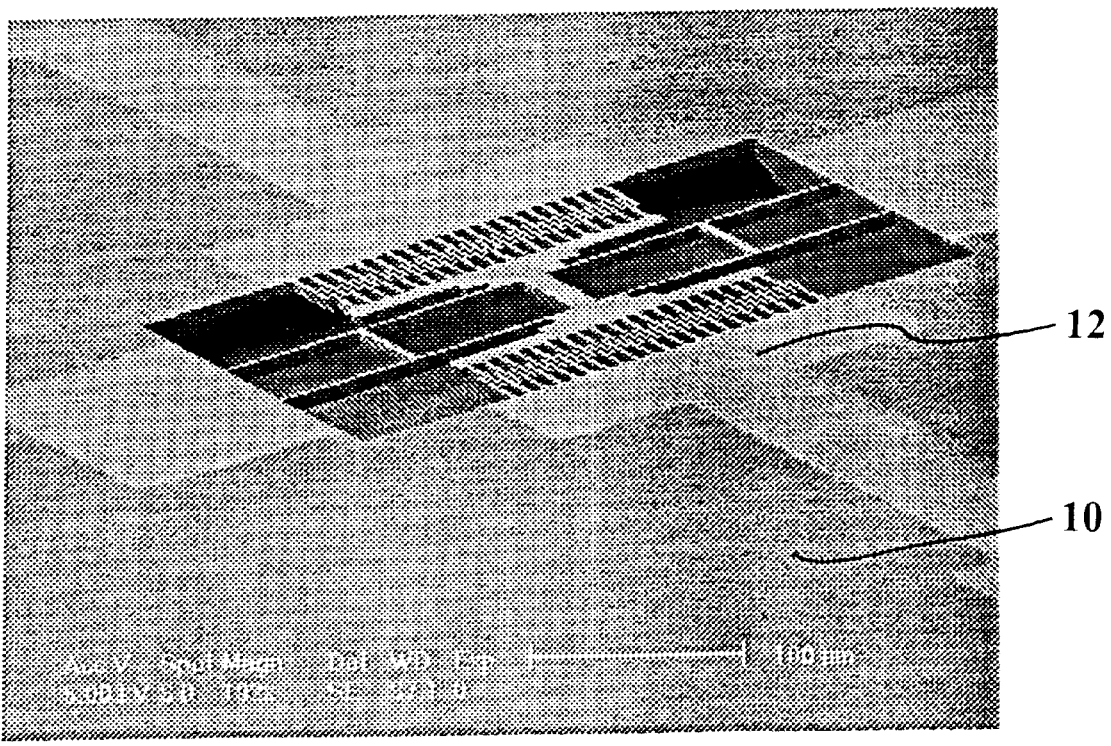
FIG. 3 shows an SEM photograph of micromachined comb-drive structure including the junction isolation method.
Figure 4:
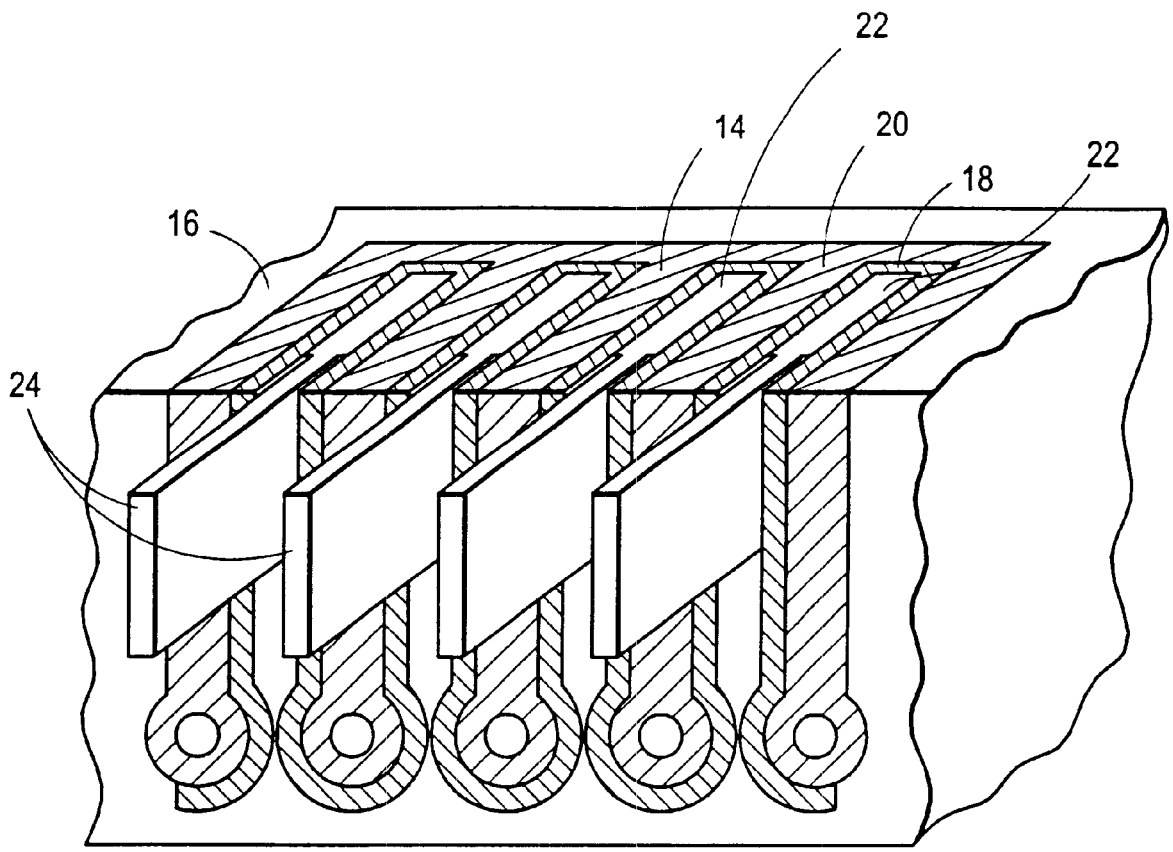
FIG. 4 is a schematic diagram illustrating a trench oxide isolation method.

Particularly preferred embodiments of the present invention provide an isolation method for microelectromechanical systems, preferably made on a silicon substrate, using a deep trench insulation layer. A preferred method forms one or more trenches in an interior portion of a structure to be isolated and fills the one or more trenches with an insulating layer. Subsequent patterning processes define the electrodes, the structure and etch holes in the interior of the structure. Next the electrodes and the structure are separated from the underlying substrate by laterally etching the substrate, below the electrodes and structure and the etch holes. The laterally etching does not etch the insulation layer so that the insulation layers anchor the electrodes and the structure to the underlying substrate and the insulation layer supports the electrodes and the structure.

Most preferably, the trenches are formed to have a depth larger than the sum of the thickness of the electrode to be formed and the vertical separation distance between the electrode to be formed and the underlying substrate. In many instances, the trenches are formed in a middle portion of the electrode to be formed.

In some embodiments of the present invention, the pattern etching steps for the trenches, electrodes, structure, and etch holes on the silicon substrate are preferably an anisotropic, reactive ion etching processes. Additionally, according to some embodiments, the lateral "release" etching step that separates the structure and electrode portions from the underlying substrate is performed according to the following guidelines. If the substrate is a (111)-oriented silicon wafer, the release etching is preferably performed using an alkaline solution having preferentially slow etch rates for {111} planes. A description of such a release etch is described in U.S. Pat. No. 6,150,275, which patent is hereby incorporated by reference in its entirety. On the other hand, if the substrate is a silicon wafer of (100) or (110) orientation, the lateral release etching is performed using an isotropic etching gas such as $XeF_2$, or the like.

Practice of preferred aspects of the present invention provide an isolation method for microelectromechanical systems that does not require two different release steps to separate the electrode part from the substrate and to separate the micromechanical structure part from the substrate. Preferred implementations provide an isolation method for microelectromechanical systems, which does not require separate photolithography and etching steps for metallization of electrodes. The deep trench isolation does not limit the separation distance between the sidewalls of the electrode and the sidewalls of the substrate. In addition, the insulating layer of the trench isolation structure does not attach the electrode to the sidewalls of the substrate, thereby allowing the fabrication of electrodes in arbitrary shapes, including an "island" shape.

Now, further discussion of preferred aspects of an isolation method for a microelectromechanical system using a deep trench insulation layer is provided with reference to the accompanying drawings.

Figure 5:
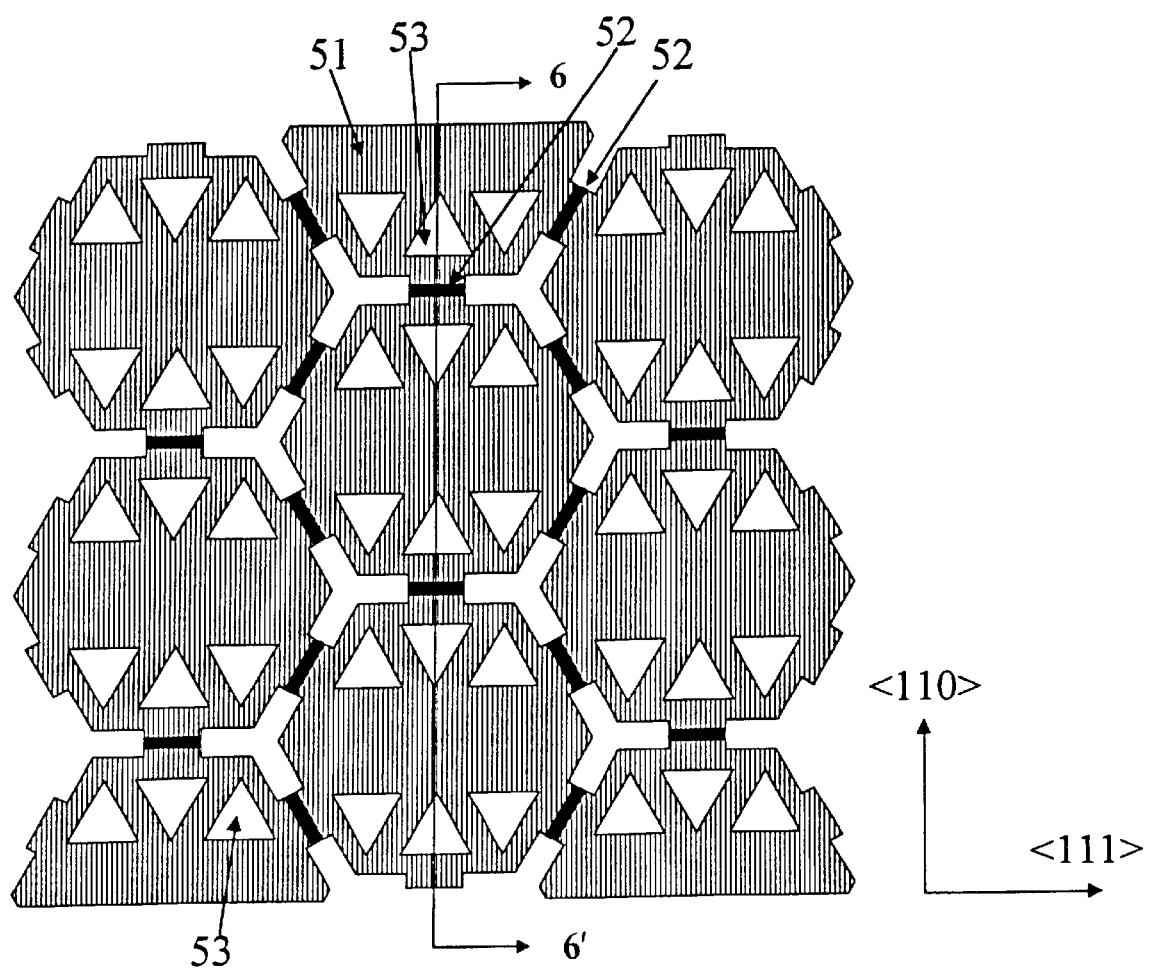
FIG. 5 shows a schematic view of an electrode with etch holes and insulation layer filled trenches according to a preferred embodiment of the present invention.

FIG. 5 shows a schematic plan view of an electrode with etch holes and insulation layer filled trenches. FIGS. 6a to 6g show a process flow example of fabricating the isolated electrode in FIG. 5, shown along the cross section 6–6' illustrated in FIG. 5.

FIG. 5 shows trenches 52 filled with insulation layers so that the combined structure supports the silicon electrode 51 and tethers the electrode to a surface of the underlying substrate. Most preferably, the insulation layer is not present between the sides of the electrode 51 and the sides of the substrate, but is instead provided in one or more trenches in the interior or middle part of the electrode. Etch holes 53 preferably are also formed in the interior part and around the perimeter of the electrodes 51. The etch holes 53 electrically isolate the electrodes from the silicon substrate and from other electrodes by air gaps. A transverse or lateral dimension of an etch hole may be made arbitrarily large, thereby reducing the parasitic capacitance between adjacent electrodes. Capacitance across an air gap is inversely proportional to the gap distance.

Figure 6A:
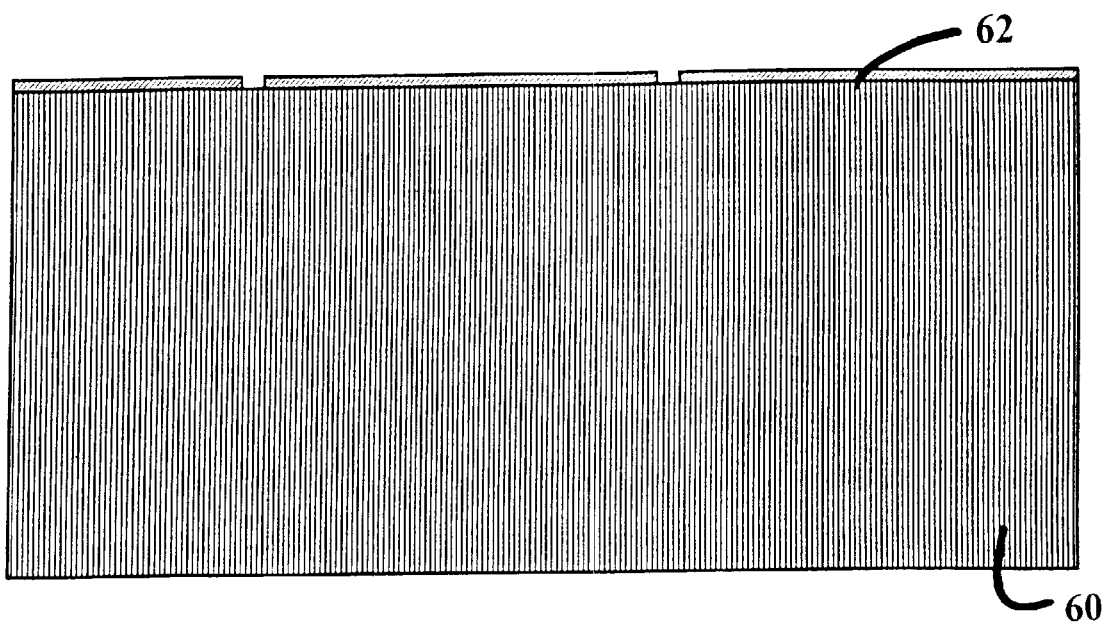
FIGS. 6a to 6g show a process flow example for fabricating the isolated electrode of FIG. 5, shown along the cross section 6–6' in FIG. 5.
Figure 6B:
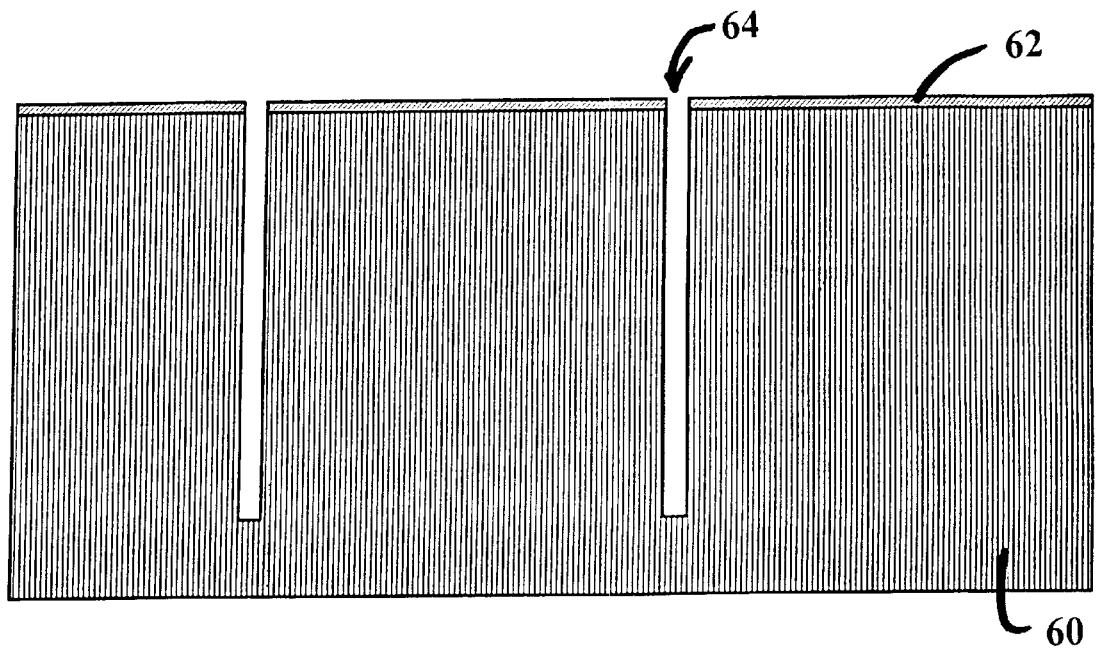
Figure 6C:
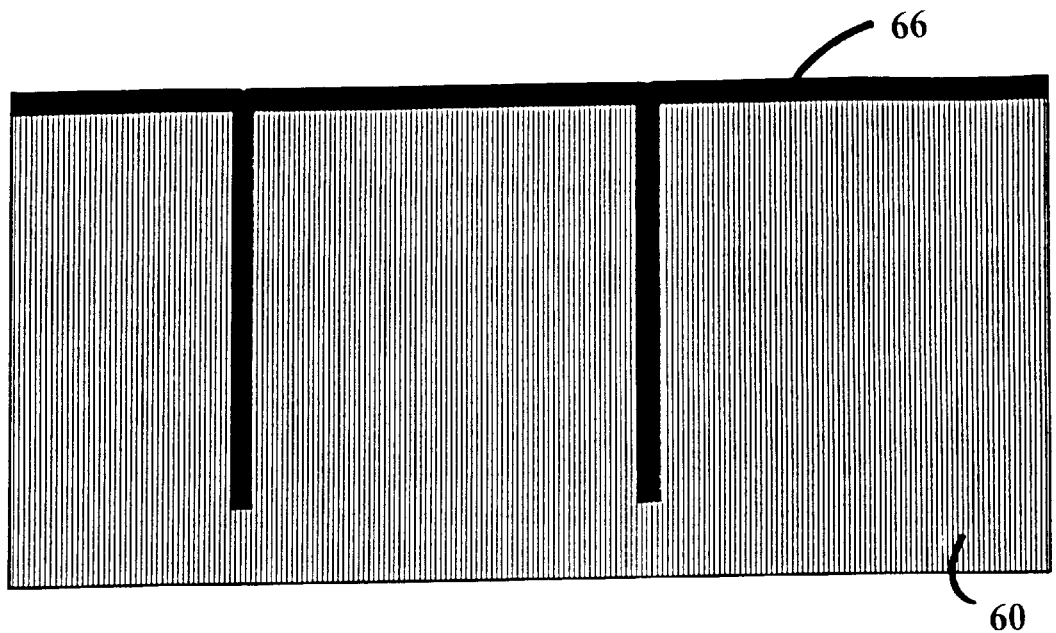

A preferred process for fabricating the structure shown in FIG. 5 is explained with reference to FIGS. 6a to 6g. The illustrated structure is formed on a highly doped, low resistivity, conducting silicon wafer 60. An oxide layer 62, or other material suitable for forming an etch mask for etching deep trenches, is deposited and patterned on the silicon wafer substrate as shown in FIG. 6a. Deep trenches 64 are etched into the silicon substrate. The depth of the deep trenches is selected to be greater than the sum of the thickness of the electrode to be formed and the vertical separation distance between the electrode to be formed and the underlying substrate, as shown in FIG. 6b. This allows the trenches to extend completely through the electrode, across a gap between the electrode and substrate and into the underlying substrate by a sufficient depth to tether the electrodes. The deep trenches 64 shown in FIG. 6b are filled with insulation layers 66 as shown in FIG. 6c. The insulation layer 66 used at this time may be an oxide layer, a nitride layer, or a combination of oxide and nitride layers.

Figure 6D:
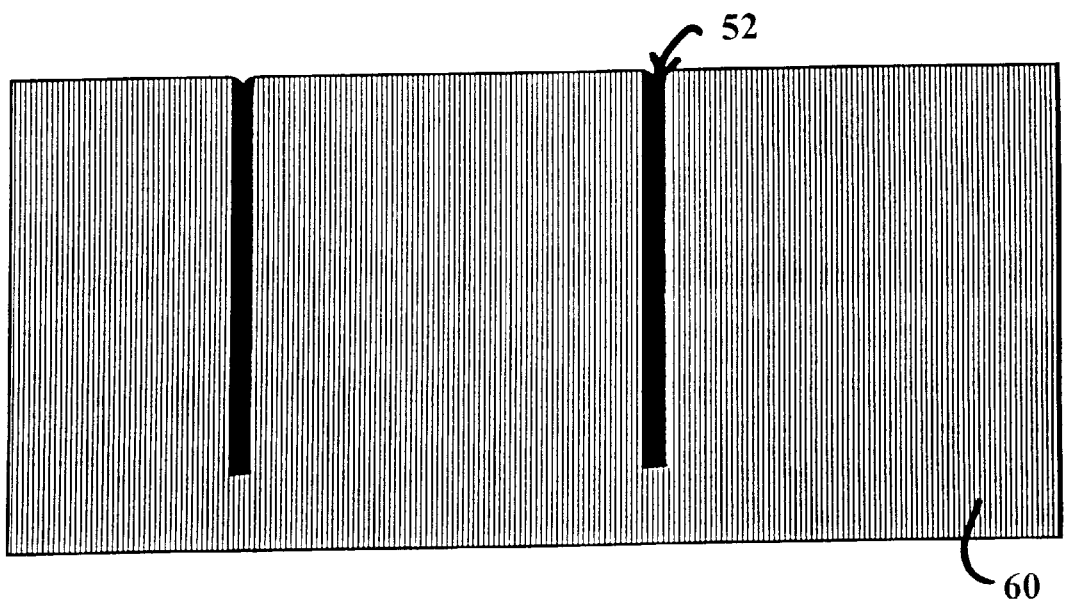
Figure 6E:
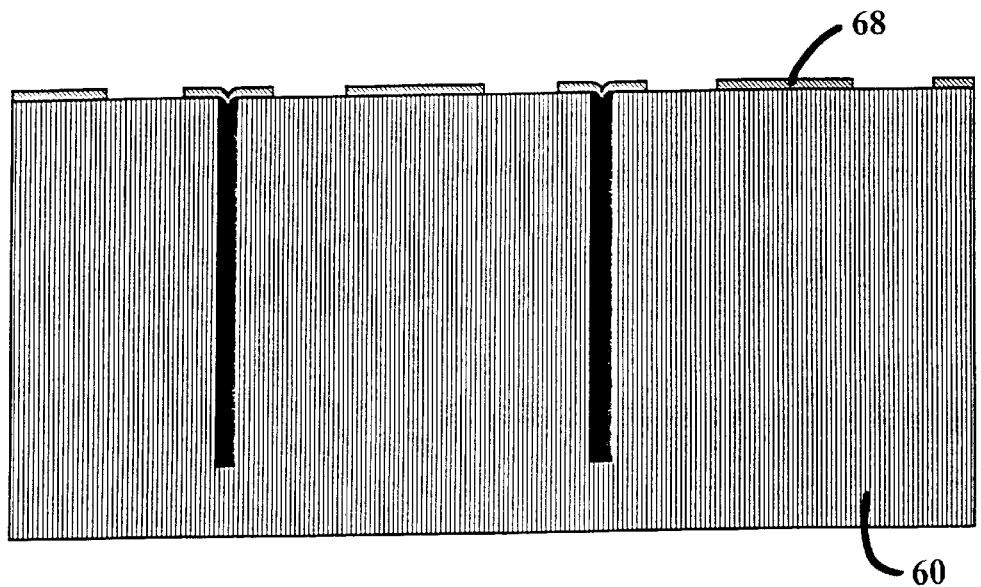
Figure 6F:
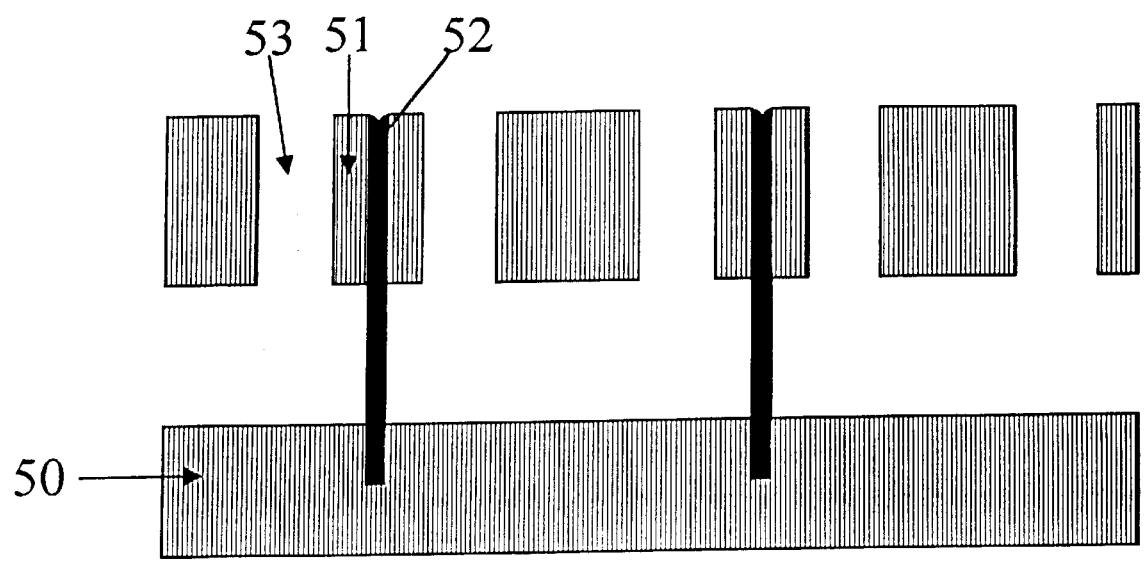
Figure 6G:
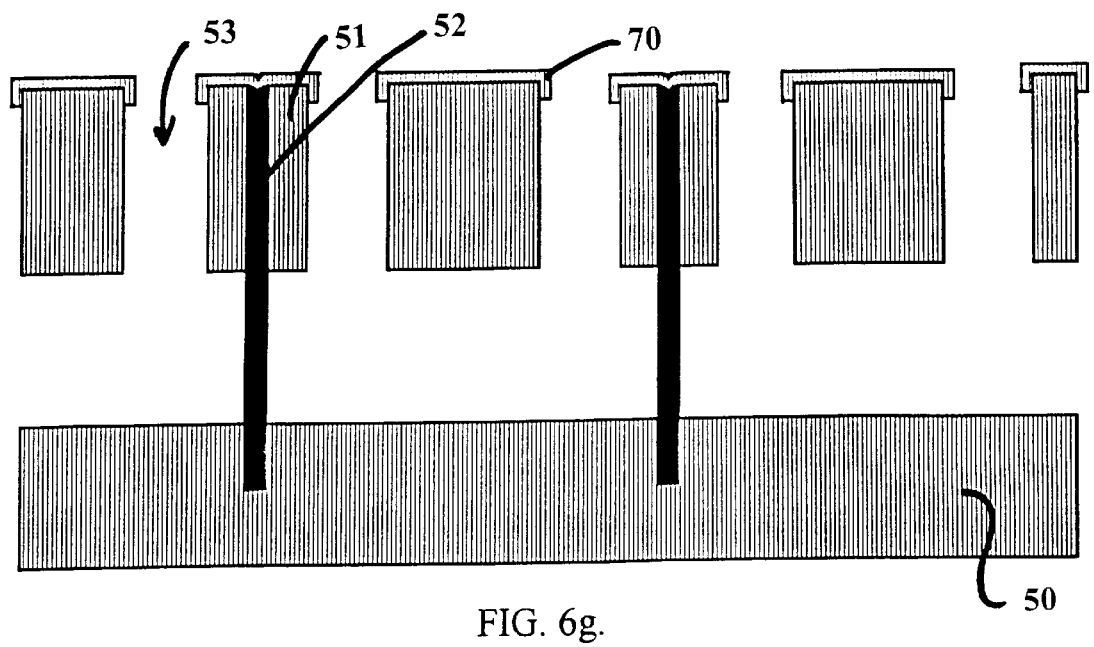

The insulation layer 66 that remains on the top surface of the silicon wafer is removed as shown in FIG. 6d, followed by deposition and patterning for the second masking material. The second masking material is patterned to form an etch mask 68 for the structure and electrodes shown in FIG. 6e. The structure and the electrodes 51 are patterned and separated from the silicon substrate as well as adjacent electrodes as shown in FIG. 6f. Subsequently, a metal film 70 is deposited on the top surfaces of the structure and electrodes as shown in FIG. 6g. The patterning and separating steps as shown in FIG. 6f presently comprise the steps of patterning parts to be separated from the adjacent parts of the silicon substrate and from the adjacent electrodes by reactive ion etching; and separating the part to be separated from the underlying silicon substrate by lateral silicon etching, including alkaline wet etching and $XeF_2$ gaseous etching.

As shown in FIG. 6f, the structure and the electrodes 51 are separated from the silicon substrate 50 at its sides and at its bottom. Insulation layers 52 fill the deep trenches and pass through the middle portions of the electrode 51 and into the underlying substrate 50 to anchor the electrode 51 to the substrate 50 and to support the electrode 51. By this process, the electrode 51 can be separated from the substrate and other electrodes, thereby assuming an "island" shape, so that the electrode 51 is electrically insulated from the substrate and other electrodes by the insulating layers and air gaps.

As noted, insulation layers are not formed on the sides of the electrode 51 but are instead formed within the interior or middle of the electrode 51 and anchored to the substrate 50. Consequently, there is no need to insert insulation layers between the electrode and the sidewalls of the silicon substrate. This allows the structure and electrodes to be fabricated in many different shapes. Hence, the isolation method according to the present invention can be applied in fabricating complex structures where the arrangement of electrodes may be very complicated.

Furthermore, because the structure and electrodes are separated from the substrate in a single release step as shown in FIG. 6f, there is no need to perform separate release steps for releasing the structure and releasing the electrodes. This represents a process simplification that should yield a cost reduction.

Additionally, the metal layer 70 is deposited on the surfaces of the structure and electrodes formed by the release step as shown in FIG. 6g, and thus there is no need to carry out different photolithography and etching steps for patterning the metal layer 70.

Figure 7:
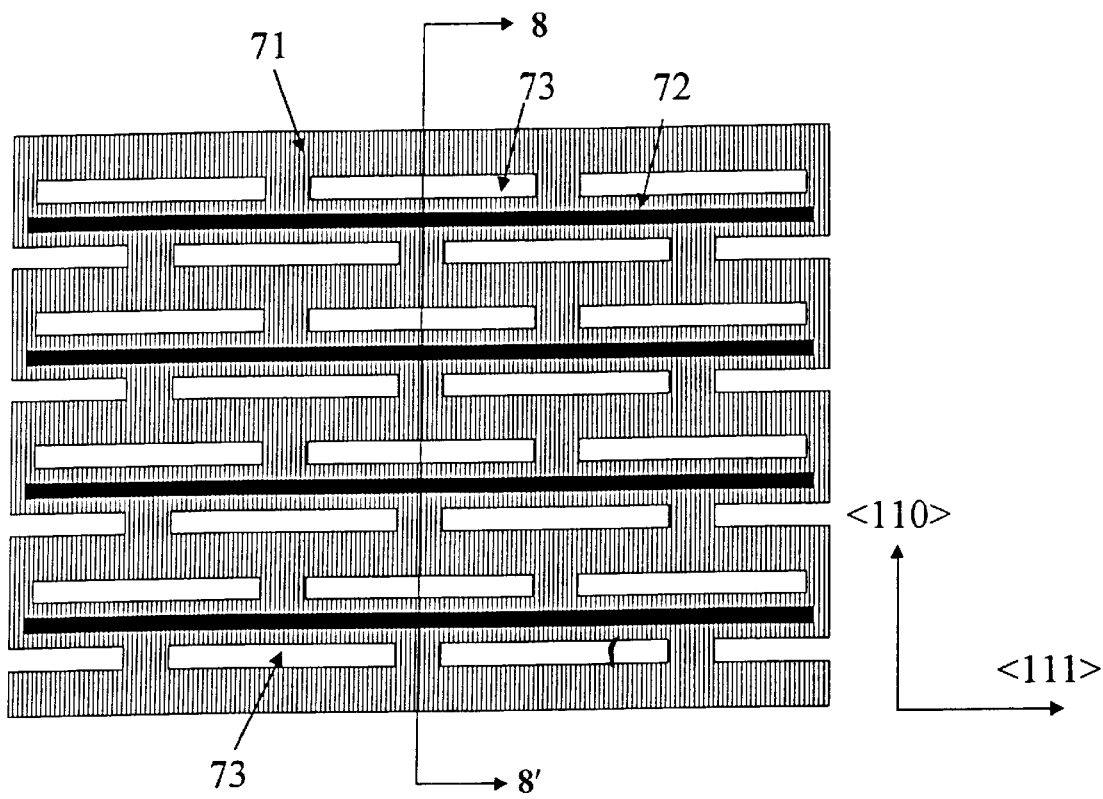
FIG. 7 shows a schematic view of an electrode with etch holes and insulation layer filled trenches, according to another preferred embodiment of the present invention.

FIG. 7 shows a schematic view of an electrode with etch holes and insulation layer filled trenches, representing another preferred embodiment of the present invention. FIGS. 8a to 8g show an exemplary process flow example for fabricating the isolated electrode in FIG. 7, shown along the cross section 8—8' in FIG. 7.

As shown in FIG. 7, trenches 72 are formed through the electrode and filled with insulation layers to support the silicon electrode 71. As with the previous discussion, the insulation layers need not be formed between the sides of the electrode 71 and the sides of the substrate. Rather the insulation layers can be formed entirely in the interior of the electrode. Etch holes 73 are also formed in the middle part and around the perimeter of the electrodes 71. By forming these etch holes 73, the electrodes are electrically isolated from the silicon substrate and from other electrodes by air gaps. A lateral or transverse dimension of an etch hole may be made arbitrarily large, thereby allowing a small parasitic capacitance to exist between the electrodes insulated and supported by this technique. As noted earlier, capacitance across an air gap is inversely proportional to the gap distance.

The process flow as shown in FIGS. 8a to 8g is identical to that in FIGS. 6a to 6g, with the exception that the patterns of the structure and electrodes are different. As such, details of the process flow are not repeated here, but can instead be understood from the above description of the process of FIG. 6.

Figure 8A:
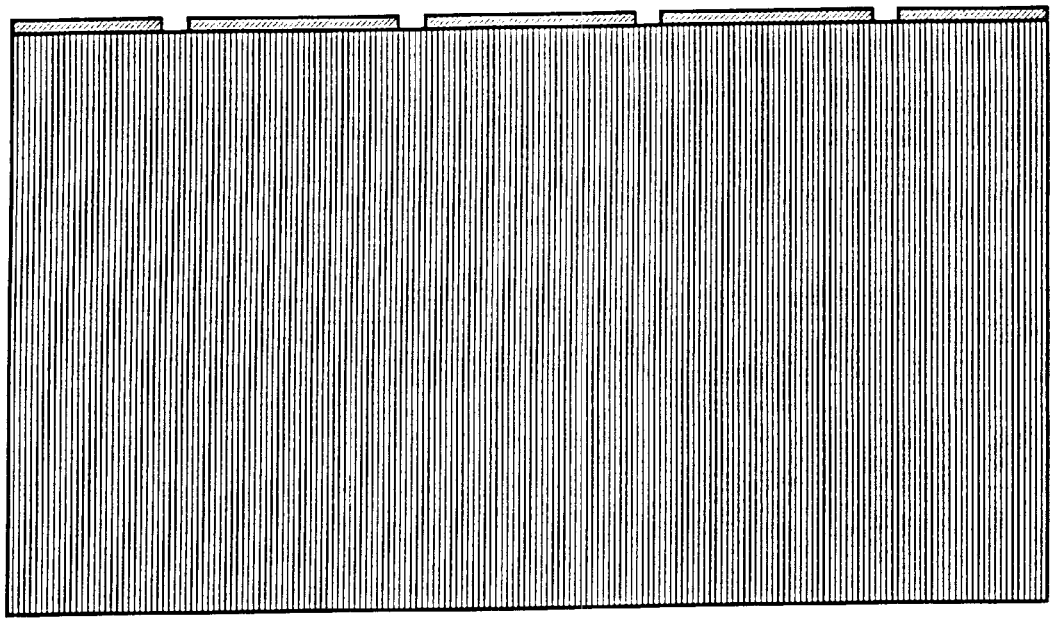
FIGS. 8a to 8g show an exemplary process flow for fabricating the isolated electrode in FIG. 7, shown along the cross section 8–8' in FIG. 5.
Figure 8B:
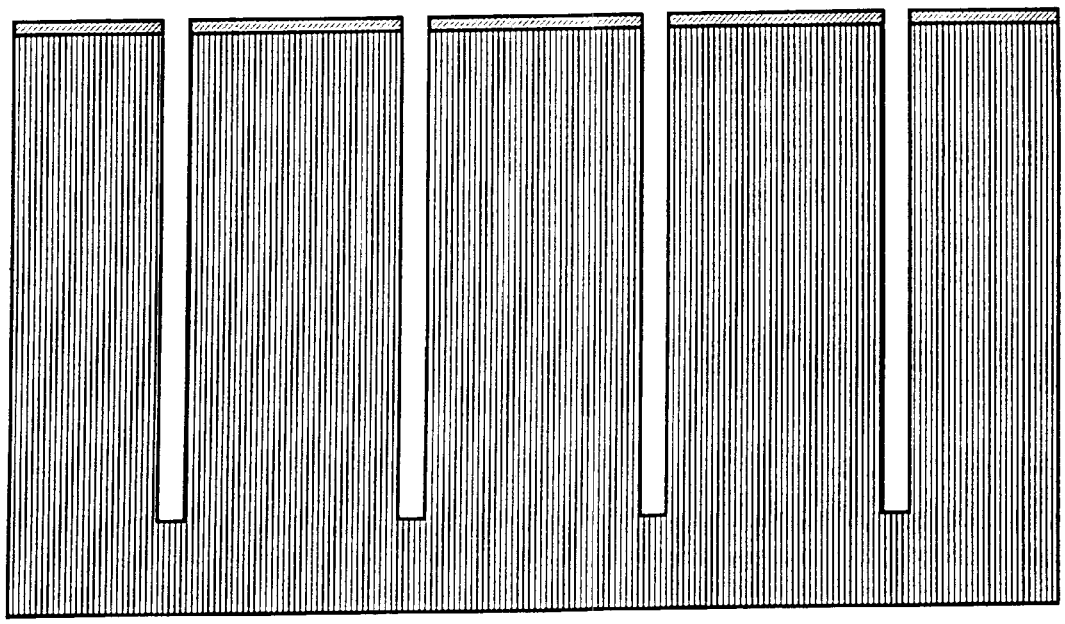
Figure 8C:
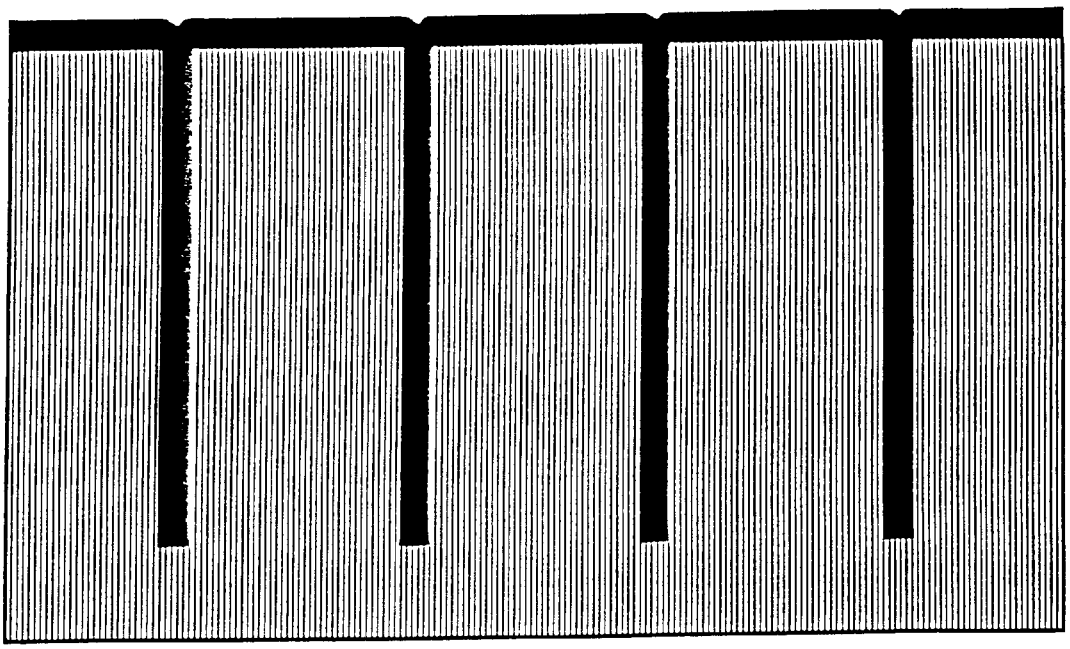
Figure 8D:
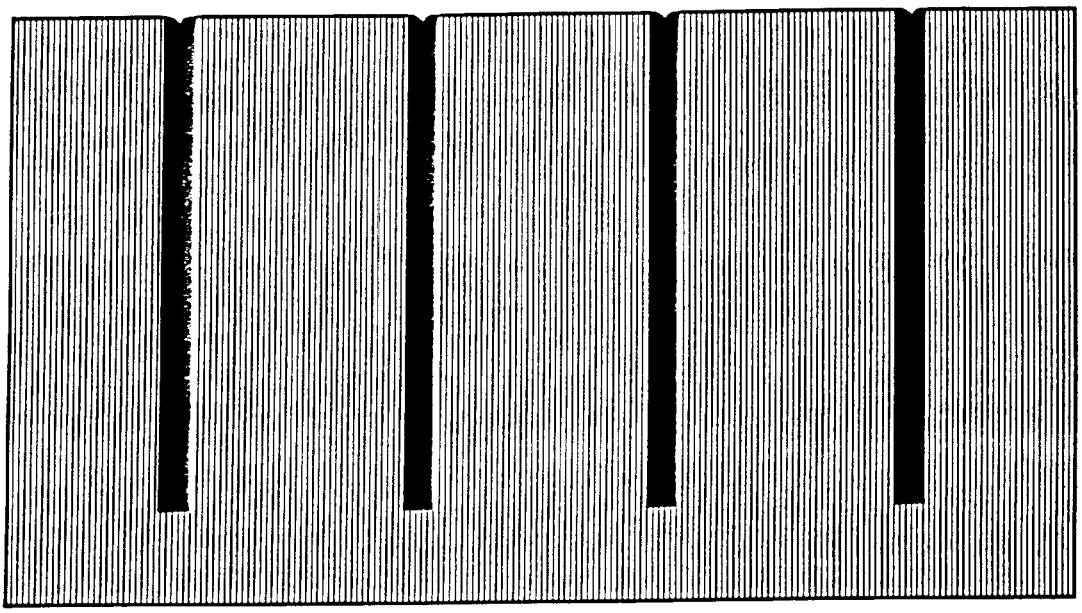
Figure 8E:
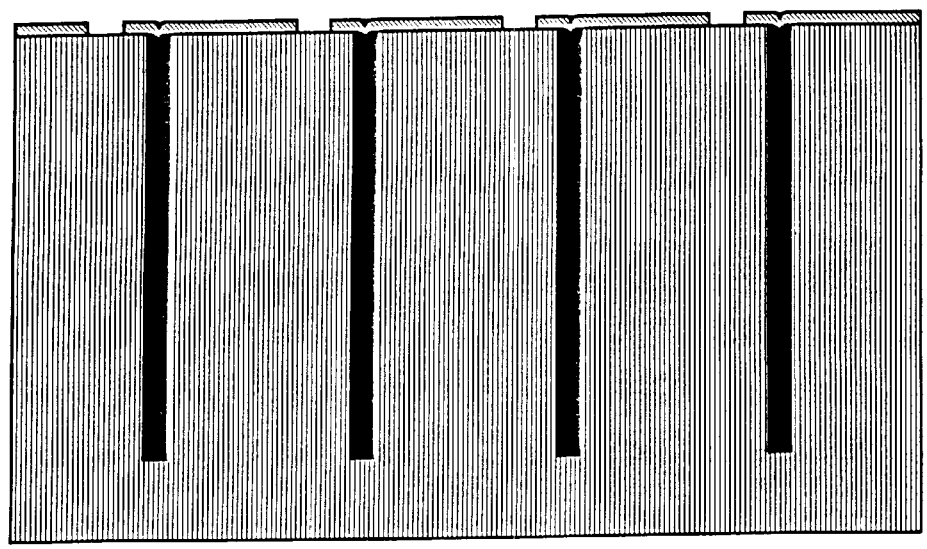
Figure 8F:
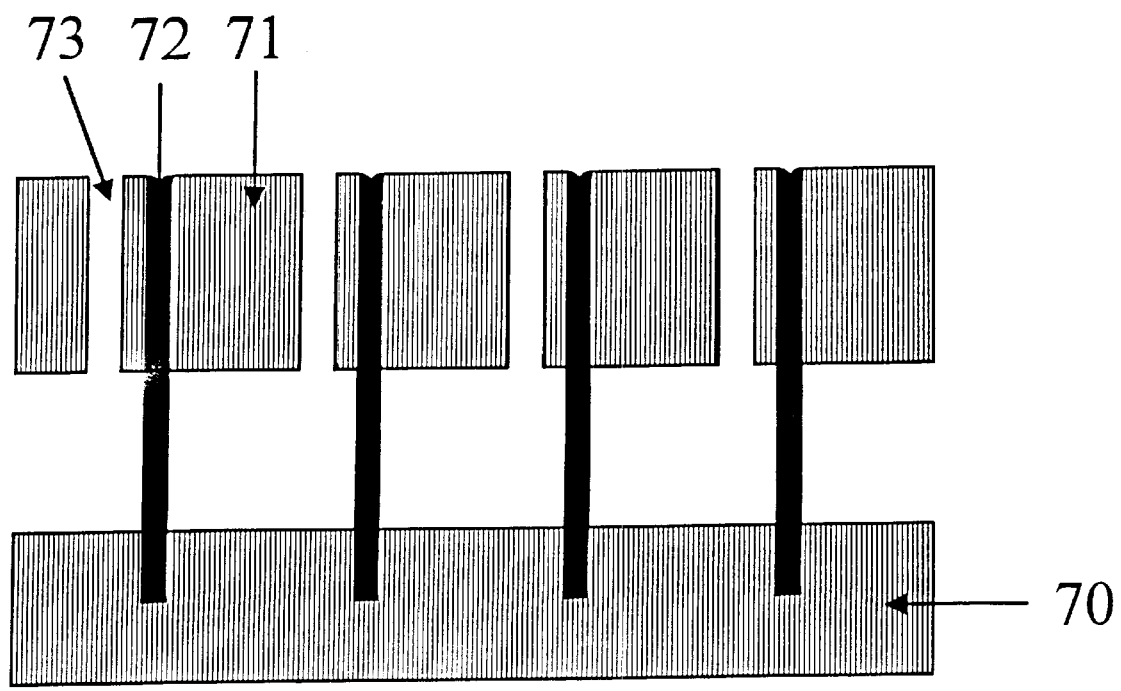

The cross section of FIG. 8f illustrates the result of the FIG. 8 process and a cross section through the illustration of FIG. 7. The structure and the electrodes 71 are separated from the silicon substrate at the electrodes' sides and at the electrodes' bottom The insulation layers 72 that fill the deep trenches passing through the middle of the electrode 71 are anchored to the substrate 70 and support the electrode 71.

In addition, the electrode 71 can be separated from the substrate and other electrodes, while assuming an "island" shape, such that the electrode 71 is electrically insulated from the substrate and other electrodes by the air gap As noted, the insulation layers are not formed on the sides of the electrode 71 but are instead formed through interior portions of the electrode 71 to anchor the electrode to the substrate 70. There is consequently no need to insert insulation layers between the electrodes and the sidewalls of the silicon substrate This allows the structure and electrodes to be fabricated in many different shapes. Hence, the isolation method according to the present invention can be applied in fabricating complex structures where the arrangement of electrodes may be very complicated.

Furthermore, the structure and electrodes are separated from the substrate in a single release step as shown in FIG. 8f, so that there is no need to perform separate release steps for releasing the structure and releasing the electrodes.

Figure 8G:
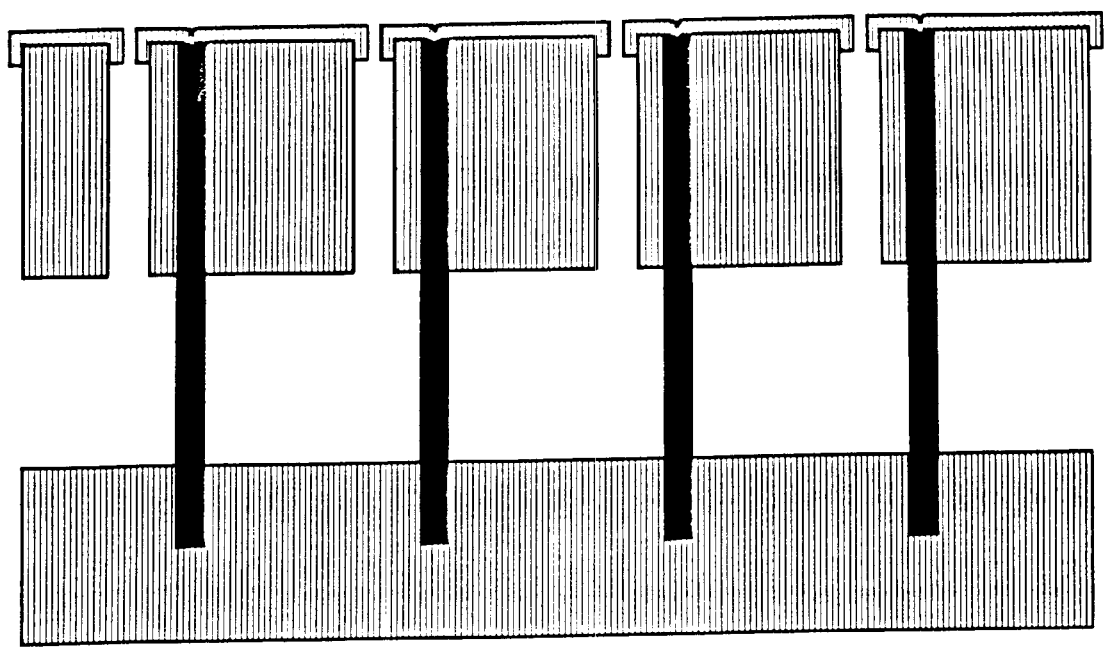

Additionally, the metal layer is deposited on the surfaces of the structure and electrodes formed by the release step as shown in FIG. 8g and thus there is no need to carry out different photolithography and etching steps for patterning of metal layer.

The isolation methods of the present invention can be applied to various silicon microelectromechanical sensors and actuators, including but not limited to, accelerometers, gyroscopes, and mirror arrays.

Figure 9:
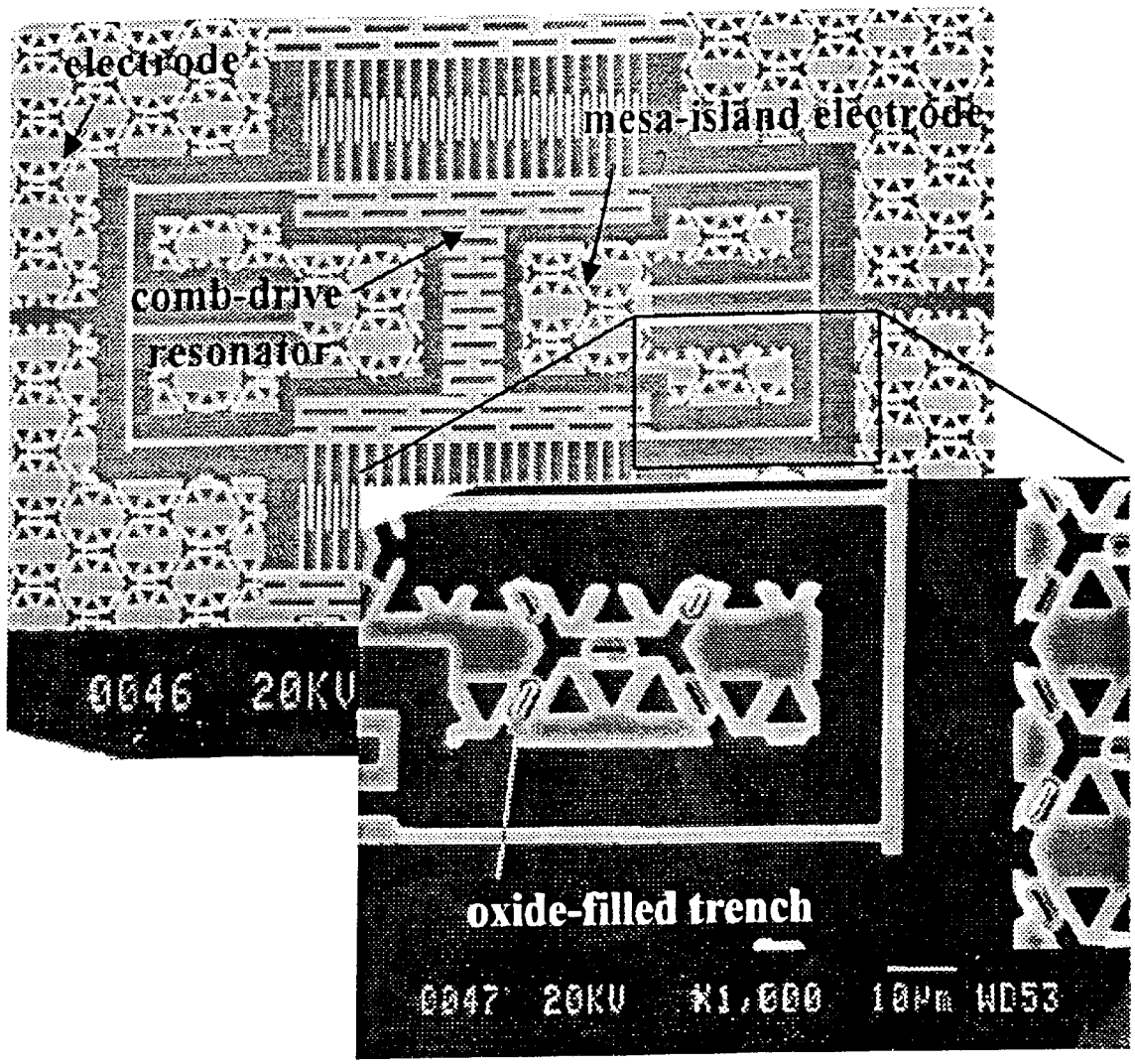
FIG. 9 shows an SEM photograph of an electrically isolated comb-drive resonator fabricated of single crystal silicon made by the process steps in FIGS. 5 and 6a to 6g.
Figure 10:
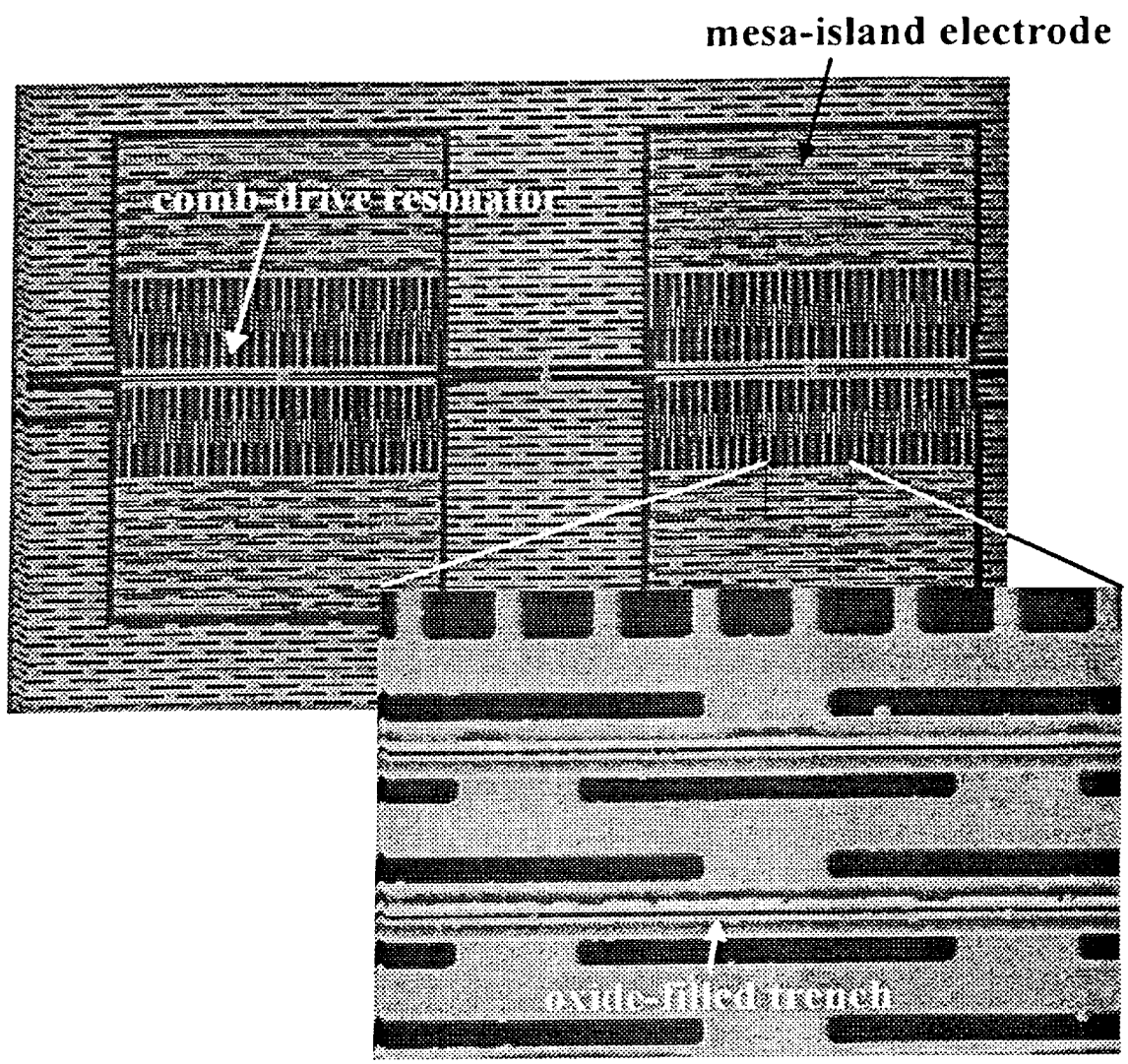
FIG. 10 shows an SEM photograph of another electrically isolated comb-drive resonator fabricated of single crystal silicon made by the process steps in FIG. 7 and 8a to 8g.

FIG. 9 shows an SEM photograph of a comb-drive resonator having the honey-comb patterned insulating pillars as shown in FIG. 5 and FIGS. 6a to 6g. FIG. 10 shows an SEM photograph of another comb-drive resonator having the insulating wall structures as shown in FIG. 7 and FIGS. 8a to 8g. These comb-drive resonators shown in FIGS. 9 and 10 are electrically insulated and have been electrostatically driven in atmospheric pressure.

Although the present invention has been described in detail with reference to certain presently preferred embodiments, those of ordinary skill in the art will appreciate that various modifications can be made without departing from the invention. Accordingly, the invention is not to be limited to any of the described embodiments thereof but is instead defined by the following claims.

What is claimed is:

1. An isolation method for microelectromechanical systems, comprising:

etching a trench into a substrate, the trench having a depth at least as large as a sum of a thickness of an electrode to be formed and a separation distance between the electrode to be formed and an underlying surface of the substrate, the trench formed in an interior portion of the electrode to be formed;

forming an insulation layer within the trench;

patterning the electrode by etching around a periphery of the electrode to a depth greater than a thickness of the electrode; and laterally etching the substrate, below the electrode, to at least partially separate the electrode from the underlying substrate, leaving the insulation layer in at least part of the trench so that the insulation layer anchors the electrode to the substrate and provides support for the electrode.

2. The isolation method of claim 1, further comprising forming etch holes within the electrode extending through the electrode, the laterally etching the substrate proceeding in part through the etch holes.

3. The isolation method of claim 1, wherein the etching a trench and the patterning the electrode and the forming etch holes are anisotropic, reactive ion etching processes.

4. The isolation method of claim 1, wherein the substrate is a (111)oriented silicon wafer and the lateral etching step for separating the electrode from the underlying substrate is an alkaline solution etching process.

5. The isolation method of claim 1, wherein the substrate is a silicon wafer having a (100) or (110) orientation and the lateral etching step for separating the electrode from the underlying substrate is an isotropic. $XeF_2$ gas etching process.

6. The isolation method of claim 1, wherein the insulation layer is an oxide layer, a nitride layer, or a combination thereof.

7. The isolation method of claim 1, further comprising depositing a metal layer on a surface of the electrode after the laterally etching.

8. An isolation method for microelectromechanical systems made of silicon, the isolation method using deep trench insulation layers, the isolation method comprising:

(a) forming trenches to have a depth larger than the sum of the thickness of electrodes to be formed and a vertical separation between the electrodes to be formed and the underlying substrate; the trenches formed in middle portions of the electrodes to be formed;

(b) filling the trenches with insulation;

(c) patterning the electrodes and patterning etch holes toward the underlying substrate; and (d) separating the electrodes from the underlying substrate by etching the substrate laterally, below the electrodes and through the etch holes, so that the insulation in the trenches provides support for the electrodes spaced from the underlying substrate.

9. The isolation method of claim 8, wherein the etching the trenches and the patterning the electrodes and etch holes comprise anisotropic, reactive ion etching processes.

10. The isolation method of claim 8, wherein the substrate is a (111)-oriented silicon wafer and the lateral etching for separating the electrodes from the underlying substrate is an alkaline solution etching process.

11. The isolation method of claim 8, wherein the substrate is a silicon wafer having a (100) or (110) orientation and the lateral etching step for separating the electrodes from the underlying substrate is an isotropic $XeF_2$ gas etching process.

12. The isolation method as claimed in claim 8, wherein the insulation layer is an oxide layer, a nitride layer, or a combination thereof.

13. The isolation method as claimed in claim 8, further comprising depositing a metal layer on upper surfaces of the electrodes.

14. The isolation method of claim 1, wherein the electrode and the substrate comprise the same material.

15. The isolation method of claim 1, wherein the electrode comprises the substrate.

16. The isolation method of claim 1, wherein the electrode comprises silicon.

17. The isolation method of claim 8, wherein the electrode and the substrate comprise the same material.

18. The isolation method of claim 8, wherein the electrode comprises the substrate.

19. The isolation method of claim 8, wherein the electrode comprises silicon.

* * * * *